(12) United States Patent
Holloway et al.

(10) Patent No.: US 9,930,801 B2
(45) Date of Patent: Mar. 27, 2018

(54) ELECTRONIC DEVICE AND CIRCUIT BOARDS THEREOF

(71) Applicant: Hewlett Packard Enterprise Development LP, Houston, TX (US)

(72) Inventors: Scott Edwards Holloway, Houston, TX (US); Charles W. Cochran, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 31 days.

(21) Appl. No.: 15/119,033

(22) PCT Filed: Feb. 14, 2014

(86) PCT No.: PCT/US2014/016501
§ 371 (c)(1),
(2) Date: Aug. 15, 2016

(87) PCT Pub. No.: WO2015/122908
PCT Pub. Date: Aug. 20, 2015

(65) Prior Publication Data
US 2016/0360634 A1    Dec. 8, 2016

(51) Int. Cl.
*H05K 7/04* (2006.01)
*G01R 31/04* (2006.01)
(Continued)

(52) U.S. Cl.
CPC .............. *H05K 7/04* (2013.01); *G01R 31/04* (2013.01); *H05K 1/18* (2013.01); *H05K 7/1432* (2013.01)

(58) Field of Classification Search
CPC .......... H05K 7/04; H05K 1/18; H05K 7/1432; G01R 31/04
See application file for complete search history.

(56) References Cited

U.S. PATENT DOCUMENTS 8,525,477 B2   9/2013  Zeng et al.
8,571,738 B1   10/2013 Potter et al.
(Continued)

FOREIGN PATENT DOCUMENTS

JP    2007149787 A    6/2007
JP    2012114186 A    6/2012

OTHER PUBLICATIONS

ISR/WO, PCT/US2014/016501, HP reference 83765140, dated Nov. 13, 2014, 9 pps.
(Continued)

*Primary Examiner* — Jermele M Hollington
*Assistant Examiner* — Zannatul Ferdous
(74) *Attorney, Agent, or Firm* — Lakshmikumaran and Sridharan (57) ABSTRACT

Circuit boards for an electronic device are described. In one implementation, the circuit board includes at least two holes at two locations on the circuit board. Each of the at least two holes has a conductive contact coupled to a voltage source through a resistor. The circuit board includes a microcontroller programmed to measure voltages at conductive contacts of the at least two holes, and determine a position of the circuit board, when positioned on a conductive chassis of the electronic device, based on the measured voltages. The position of the circuit board may be one of a first end and a second end, and in between the first end and the second end, of the conductive chassis.

15 Claims, 5 Drawing Sheets

(51) Int. Cl.
  *H05K 1/18* (2006.01)
  *H05K 7/14* (2006.01)

(56) References Cited

U.S. PATENT DOCUMENTS

| | | |
|---|---|---|
| 2007/0091658 A1 | 4/2007 | Wiktor et al. |
| 2009/0236909 A1 | 9/2009 | Aldag et al. |
| 2010/0149738 A1 | 6/2010 | Chang et al. |
| 2010/0290203 A1 | 11/2010 | Nagasaki |
| 2012/0307468 A1 | 12/2012 | Suzuki et al. |

OTHER PUBLICATIONS

Parker, T., "AC Module Installation 101: New Wiring Consideration and Safety Guidelines," (Research Paper), Jun. 2012, pages, available at http://solarbridgetech.com/ac-module-installation-101-new-wiring-considerations-and-safety-guidelines/.

ELECTRONIC DEVICE AND CIRCUIT BOARDS THEREOF

BACKGROUND

Electronic devices having a plurality of circuit boards are used for a variety of applications, such as power distribution and battery monitoring. The circuit boards, also referred to as electrical boards, are typically mounted on an electrically conductive chassis of the electronic device. Depending on the application or the use, the circuit boards in an electronic device may have to be ordered. The ordering may include mounting the circuit boards at appropriate positions on the conductive chassis. The ordering may be done for various purposes, for example, for determining a total number of circuit boards in the electronic device, for determining ordinal positions of circuit boards in the electronic device, and for terminating a differential bus for data communication in the electronic device.

BRIEF DESCRIPTION OF DRAWINGS

The detailed description is provided with reference to the accompanying figures. In the figures, the left-most digit(s) of a reference number identifies the figure in which the reference number first appears. The same numbers are used throughout the drawings to reference like features and components.

DETAILED DESCRIPTION

Aspects of the present subject matter relate to electronic devices, circuit boards for an electronic device, and methods of configuring an electronic device having multiple circuit boards.

An electronic device, such as the one used for power distribution, may have multiple circuit boards and outlets mounted on an electrically conductive chassis for distribution of an input power to various electrical/electronic components. In such an electronic device, electricity metering data for the circuit boards and the outlets may be provided to a central controller for further processing. The electricity metering data may include the current consumption at an outlet of a circuit board, the power factor for the component connected at an outlet of a circuit board, and the like. The central controller may determine from which circuit board and which outlet is the electricity metering data being provided. For example, an electronic device with 30 outlets for power distribution may have five circuit boards, each with six outlets. The circuit boards may be arranged serially on an electrically conductive chassis or a metal chassis, with the first circuit board having outlets numbered 1 to 6, the second circuit board having outlets numbered 7 to 12, the third circuit board having outlets numbered 13 to 18, and so on. For such an electronic device, the central controller discerns whether the electricity metering data being provided to the central controller is from the first circuit board having outlets 1 to 6, or the third circuit board having outlets 13 to 18, or the fifth circuit board having outlets 25 to 30.

For this, dual in-line package (DIP) switches or jumpers are used for numbering the circuit boards in the electronic device. The circuit boards are generally serially numbered from one end to another end of the conductive chassis of the electronic device by the DIP switches. The DIP switch on each circuit board may be read by the controller to determine the number, which is indicative of the ordinal position of the respective circuit board. Alternatively, a series resistive network having a resistor associated with each circuit board may also be utilized for identifying the ordinal position of circuit board. In this case, the controller can determine the ordinal position of the respective circuit board based on a voltage across each resistor.

Further, in an electronic device with a plurality of circuit board, each circuit board may have a data transceiver for communication with other circuit boards, with the central controller, and with other devices. For example, for the electronic device used for power distribution in a data center, the data transceiver may be a controller area network (CAN) transceiver. The data transceivers on the circuit board may form a differential bus for data communication. The differential bus has two communication lines, a high communication line and a low communication line. In order to have an error-free communication over the differential bus, the differential bus is terminated at the circuit boards positioned at the ends of the conductive chassis of the electronic device. For this, communication lines of the differential bus are terminated on the circuit boards at both the ends using a resistor, for example, of 120 ohms.

The circuit boards at the terminal positions, i.e., on the ends of the conductive chassis of the electronic device may have to be configured specifically, for example, for the purpose of determination of total number of circuit boards, ordinal positions of the circuit boards, and/or termination of differential bus at the ends in an electronic device. In an example, the circuit boards for the terminal positions may be configured such that the ends of the series resistive network formed for determining the number and ordinal positions can be set at different voltages. In an example, the circuit boards for the terminal positions may be configured such that the differential bus can be terminated at the terminal positions. With this, the circuit boards designed and configured for the ends are to be positioned at the respective ends of the conductive chassis. Since the circuit boards are mounted manually on the conductive chassis for assembling the electronic device, there is a possibility of human error in which the circuit boards designed for the first end or the second end may not be positioned at correct positions. In such cases, the electronic device will not function correctly, and will have to be reassembled with the circuit boards at correct positions.

Electronic devices, circuit boards for electronic devices, and methods of configuring an electronic device having multiple circuit boards are described herein. The present subject matter may be implemented in electronic devices that are to be configured for determining end circuit boards for termination of differential bus, and determining total number of circuit boards and their ordinal position in the electronic device.

In accordance with the present subject matter, all the circuit boards in an electronic device can be identical. Thus, no specific circuit boards are to be designed and configured for positioning at the ends of the conductive chassis of the electronic device. Without having specific circuit boards for the ends of the conductive chassis, and with all the circuit boards being identical, installing the circuit boards at wrong positions may be avoided. This may also reduce cost and the labor that may otherwise be involved in reassembling the electronic device in case of incorrect assembly, and in producing circuit boards specifically for installation at the ends and between the ends of the conductive chassis.

In an example implementation, an electronic device may include a conductive chassis on which two or more circuit boards are mounted. The circuit boards can be identical in terms of components. Each of the circuit boards may include a microcontroller, a resistive element, and a data transceiver. The resistive elements of all the circuit boards may be of same resistance. The circuit boards, mounted on the conductive chassis, may be electrically coupled in series such that the resistive elements of the circuit boards form a series resistive network. Further, the data transceivers of the circuit boards may be coupled to form a differential bus for data communication in the electronic device.

In accordance with the present subject matter, the microcontroller of each of the circuit boards may be programmed to determine a position of the respective circuit board. The position can be a first end, or a second end, or in between the first end and the second end, of the conductive chassis of the electronic device. Based on the determination of the position of the circuit boards at the two ends, the microcontrollers of the circuit boards can operate to automatically terminate the differential bus at the first end and the second end of the conductive chassis, automatically determine the total number of circuit boards present in the electronic device, and automatically determine the ordinal position of all the circuit boards in the electronic device. The ordinal position of a circuit board is indicative of whether the circuit board is at the first position, the second position, third position and so on, from amongst the circuit boards in the electronic device.

In an example implementation, for an electronic device having two circuit boards, each circuit board may include a first hole at a first location with a conductive contact and a second hole at a second location with a conductive contact. Each circuit board may be mounted on the conductive chassis through one of these holes. In an example, the circuit board at the first end of the conductive chassis may be mounted through a metal stand-off at the first hole, and the circuit board at the second end of the conductive chassis may be mounted through a metal stand-off at the second hole. The circuit board at the first end may be referred to as a first circuit board, and the circuit board at the second end may be referred to as a second circuit board. This enables provisioning of a chassis-ground to the conductive contact of the first hole of the first circuit board, and to the conductive contact of the second hole of the second circuit board.

In an example implementation, for an electronic device having three or more circuit boards, each circuit board may include a first hole at a first location with a conductive contact, a second hole at a second location with a conductive contact, and a third hole at a third location with a conductive contact. In said example implementation, the circuit board at the first end of the conductive chassis may be mounted through a metal stand-off at the first hole, the circuit board at the second end of the conductive chassis may be mounted through a metal stand-off at the second hole, and the circuit board between the first end and the second end of the conductive chassis may be mounted through a metal stand-off at the third hole. This enables provisioning of a chassis-ground to the conductive contact of the first hole of the circuit board at the first end, to the conductive contact of the second hole of the circuit board at the second end, and to the conductive contact of the third hole of the respective circuit board between the first end and the second end.

In order to determine the positions of the circuit boards, the microcontroller of each of the circuit boards may be programmed to measure voltages at the conductive contact of the respective first hole, at the conductive contact of the respective second hole, and at the conductive contact of the respective third hole, depending on whether the electronic device has two circuit boards or more than two circuit boards. The combination of the voltages at the conductive contacts for each circuit board is indicative of the position of the respective circuit board. With reference to above mentioned example implementations, for a circuit board, if the voltage at the conductive contact of the first hole is a ground voltage, then the circuit board is determined to be at the first end, by its microcontroller. The conductive contact of the first hole is at a ground voltage due to its coupling with the chassis-ground. For a circuit board, if the voltage at the conductive contact of the second hole is a ground voltage, then the circuit board is determined to be at the second end, by its microcontroller. The conductive contact of the second hole is at a ground voltage due to its coupling with the chassis-ground. Similarly, for a circuit board, if the voltage at the conductive contact of the third hole is a ground voltage, then the circuit board is determined to be between the first end and the second end, by its microcontroller. The conductive contact of the third hole is at a ground voltage due to its coupling with the chassis-ground.

Further, in an example implementation, the conductive chassis may be provided with metal stand-offs for mounting the circuit boards on the conductive chassis. The metal stand-offs may be provided at locations in accordance with the locations of the holes through which the circuit boards at the first end, at the second end, and in between are to be mounted.

The above described configuration of the circuit boards for the electronic device and the conductive chassis, and the manner in which the circuit boards are mounted on the conductive chassis, facilitate the automatic determination the position of each of the circuit boards. This also facilitates in reducing the number of unique assemblies possible for an electronic device, thereby reducing the cost and the labor involved in assembling the electronic device.

In an example implementation, to terminate the differential bus, the microcontroller of each of the circuit boards is programmed to insert a bus termination resistor between communication lines of the differential bus of the respective circuit board, when the respective circuit board is determined to be positioned at the first end or the second end. In an example implementation, the bus termination resistor is about 120 ohms.

To determine the number of circuit boards present in the electronic device, and determine the ordinal positions of all the circuit boards in the electronic device, the microcontrollers of the circuit boards may be operated to provide a voltage difference between the two ends of the series resistive network formed by the resistive elements of the circuit boards. For this, in an example implementation, the microcontroller of each of the circuit boards is programmed to set one end of the resistive element of the respective circuit board to a first predefined voltage, when the respective circuit board is determined to be at the first end. With this, a first end of the series resistive network may be set at the first predefined voltage. Also, in said example implementation, the microcontroller of each of the circuit boards is programmed to set one end of the resistive element of the respective circuit board to a second predefined voltage, when the respective circuit board is determined to be at the second end. With this, a second end of the series resistive network may be set at the second predefined voltage. In one example, the second predefined voltage may be lower than the first predefined voltage. In an example, the first predefined voltage may be a non-zero voltage, and the second predefined voltage may be about 0 V. In an example, the first predefined voltage may be in a range from about 1 V to 10 V.

Further, in an example implementation, the microcontroller of each of the circuit boards is programmed to measure a voltage difference across the resistive element of the respective circuit board. This voltage difference may be indicative of a total number of circuit boards in the electronic device. Thus, based on the voltage difference, the microcontroller can determine the total number of circuit boards present in the electronic device.

Further, in an example implementation, the microcontroller of each of the circuit boards is programmed to measure or check a voltage at one end of the resistive element of the respective circuit board. The voltage at one end of a resistive element is indicative of an ordinal position of that particular circuit board in the electronic device. Thus, based on the voltage at the one end of the resistive element, the microcontroller can determine the ordinal position of the corresponding circuit board.

The circuit boards, the electronic devices and the methods of the present subject matter are further described with reference to FIGS. 1 to 4. It should be noted that the description and figures merely illustrate the principles of the present subject matter. It may thus understood that various arrangements can be devised that, although not explicitly described or shown herein, embody the principles of the present subject matter. Moreover, all statements herein reciting principles, aspects, and embodiments of the present subject matter, as well as specific examples thereof, are intended to encompass equivalents thereof.

Figure 1A:
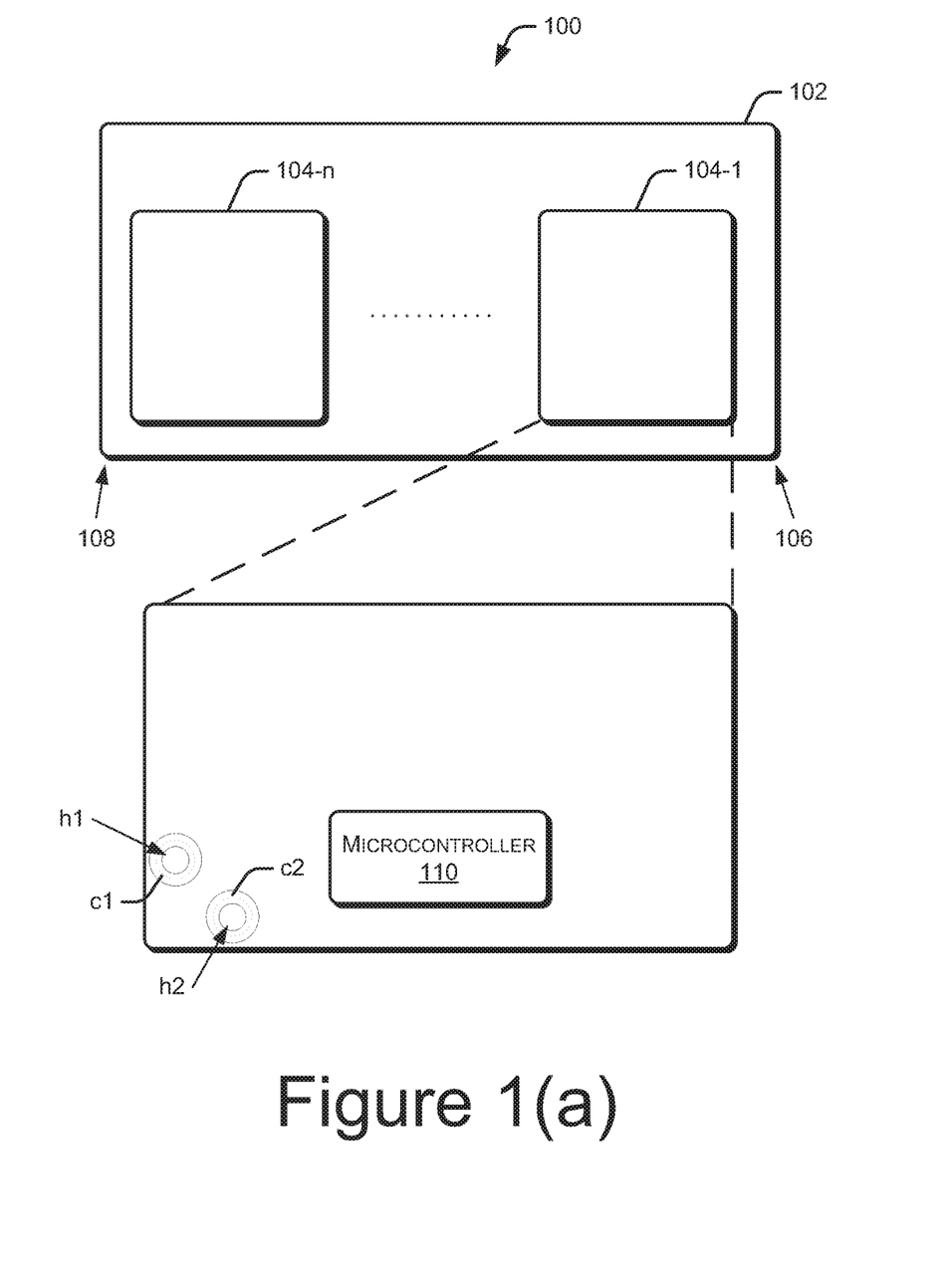
FIG. 1(a) illustrates an electronic device, according to an example of the present subject matter.

FIG. 1(a) illustrates an electronic device 100, according to an example of the present subject matter. The electronic device 100 has a longitudinally extended conductive chassis 102 on to which two or more circuit boards 104-1, . . . , 104-n may be mounted. The circuit boards 104-1, . . . , 104-n hereinafter are collectively referred to as the circuit boards 104 and individually referred to as the circuit board 104. As shown, the circuit boards 104 may be arranged adjacent to each other, along the longitudinally extended conductive chassis 102, from a first end 106 to a second end 108 of the conductive chassis 102. In an example, the conductive chassis 102 may be a metal chassis. FIG. 1(a) also shows details of one of the circuit boards 104. For the sake of simplicity, one circuit board 104-1 is shown in detail in FIG. 1(a); however, all the circuit boards 104 of the electronic device 100 can be identical to each other.

In an example implementation, for the electronic device 100 having two circuit boards 104, each of the circuit boards 104 has a first hole h1 at a first location and has a second hole h2 at a second location, as shown. The first hole h1 and the second hole h2 have conductive contacts c1 and c2, respectively, around them. In an example, the conductive contacts c1 and c2 may be metal contacts. The locations of the first hole h1 and the second hole h2 near one corner of the circuit board 104 are shown as an example illustration. In an example implementation, the two holes h1, h2, can be at any two distinct locations on the circuit board 104. The circuit board 104 at the first end 106 of the conductive chassis 102 is mounted through the respective first hole h1, and the circuit board 104 at the second end 108 of the conductive chassis 102 is mounted through the respective second hole h2. In an example implementation, the circuit boards 104 may be mounted through other holes, not shown in FIG. 1(a), for providing stability to the circuit boards 104 on the conductive chassis 102. The circuit board 104 at the first end 106 is mounted so as to provide a chassis-ground at the conductive contact c1 of the respective first hole h1, and the circuit board 104 at second end 108 is mounted so as to provide a chassis-ground at the conductive contact c2 of the respective second hole h2. Further, the mounting of the circuit board 104 through one of the holes h1 and h2, depending on its location, allows the microcontroller 110 to determine the position or the location of the circuit board 104 in the case where the electronic device 100 has two circuit boards 104.

Further, each of the circuit boards 104 includes a microcontroller 110. The microcontroller 110 of each of the circuit boards 104 is programmed to measure voltages at the conductive contact c1 of the respective first hole h1 and at the conductive contact c2 of the respective second hole h2 and determine the position of the respective circuit board 104 on the conductive chassis 102, i.e., whether the respective circuit board 104 is positioned at the first end 106 or at the second end 108. Once it is determined which circuit board 104 is at the first end 106 and at the second end 108, the microcontrollers 110 may appropriately operate to terminate a differential bus (not shown) of the electronic device 100, determine the total number of circuit boards 104 in the electronic device 100, and determine the ordinal position of each circuit board 104 in the electronic device 100. The concepts related to determining which circuit board 104 is at the first end 106, and at the second end 108, and terminating the differential bus based on the determination, determining the total number circuit boards 104, and determining the ordinal positions of the circuit boards 104, are explained in detail later with reference to the description of FIG. 2 according to one example.

Figure 1B:
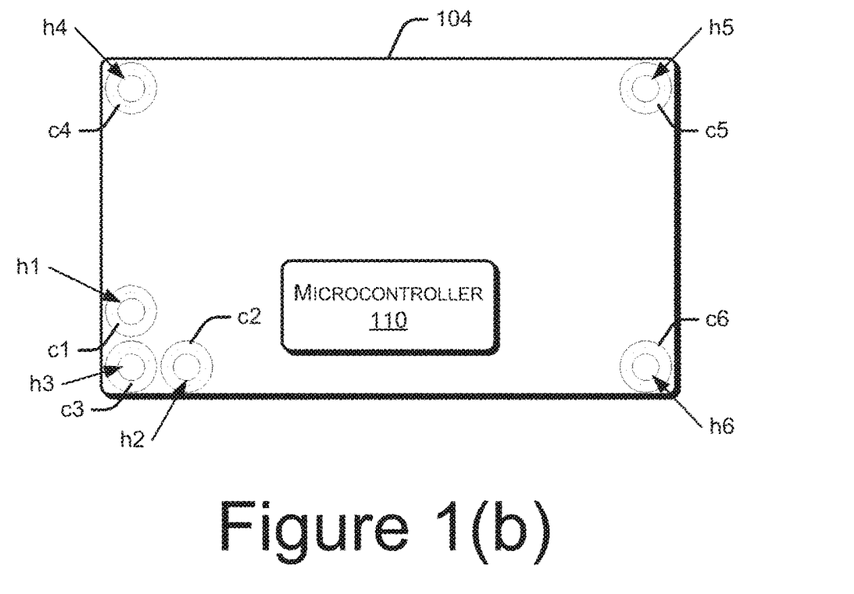
FIG. 1(b) illustrates a circuit board for an electronic device, according to an example of the present subject matter.

In an example implementation, for the electronic device 100 having three or more circuit boards 104, each of the circuit boards 104 has, in addition to the first hole h1 and the second hole h2, a third hole h3 at a third location with a conductive contact c3, as shown in FIG. 1(b). In an example, the conductive contacts c1, c2 and c3 may be metal contacts. The circuit board 104 in between the first end 106 and the second end 108 of the conductive chassis 102 is mounted through the respective third hole h3, so as to provide a chassis-ground at the conductive contact c3 of the respective third hole h3. In an example implementation, each of the circuit boards 104 may have a fourth hole h4 with a conductive contact c4, a fifth hole h5 with a conductive contact c5, and a sixth hole h6 with a conductive contact c6, respectively, at three corners of the circuit board 104. The conductive contacts c4, c5, c6 of the fourth hole h4, the fifth hole h5 and the sixth hole h6 for all the circuit boards 104 are connected to a ground of the respective circuit board 104. In an example, the conductive contacts c4, c5 and c6 may be metal contacts. The locations of the third hole h3, the fourth hole h4, the fifth hole h5, and the sixth hole h6 at the corners of the circuit board 104 are shown as an example illustration. Other locations are also possible.

The circuit boards 104 are mounted on the conductive chassis 102 through different combinations of holes depending on whether being positioned at the first end 106, at the second end 108, or in between. The description below describes in detail the mounting of circuit boards 104 on the conductive chassis 102 in the electronic device 100 having three or more circuit boards 104.

The circuit board 104 when positioned at the first end 106 of the conductive chassis 102 is mounted through the respective first hole h1, the respective fourth hole h4, the respective fifth hole h5, and the respective sixth hole h6. The mounting is using metal stand-offs (not shown) at these holes h1, h4, h5, h6. Such mounting through the metal stand-offs provides a chassis-ground to the conductive contacts c1, c4, c5, c6 for the circuit board 104 positioned at the first end 106. The circuit board 104 when positioned at the second end 108 of the conductive chassis 102 is mounted through the respective second hole h2, the respective fourth hole h4, the respective fifth hole h5, and the respective sixth hole h6. The mounting is using metal stand-offs (not shown) at these holes h2, h4, h5, h6. Such mounting through the metal stand-offs provides a chassis-ground to the conductive contacts c2, c4, c5, c6 for the circuit board 104 positioned at the second end 108. The circuit board 104 when positioned in between the first end 106 and the second end 108 of the conductive chassis 102 is mounted through the respective third hole h3, the respective fourth hole h4, the respective fifth hole h5, and the respective sixth hole h6. The mounting is using metal stand-offs (not shown) at these holes h3, h4, h5, h6. Such mounting through the metal stand-offs provides a chassis-ground to the conductive contacts c3, c4, c5, c6 for the circuit board 104 positioned between the first end 106 and the second end 108. The provisioning of the holes h1 to h6 substantially near the corners of the circuit board 104 and mounting as describe above, helps in providing a substantial stability to each circuit board 104 in the electronic device 100. Further, the mounting of the circuit board 104 through one of the holes h1, h2, or h3, depending on its location, allows the microcontroller 110 to determine the position or the location of the circuit board 104 in the case where the electronic device 100 has three or more circuit boards 104.

In an example implementation, the conductive chassis 102 is provided with metal stand-offs for coupling the circuit boards 104. The conductive chassis 102 has metal stand-offs at locations that match with the locations of the holes through which the circuit boards at the first end 106, at the second end 108, and in between are mounted. The conductive chassis 102 may have metal stand-offs at locations depending on whether the conductive chassis 102 is for an electronic device 100 having two circuit boards or for an electronic device 100 having three or more circuit boards 104. In an example, for the electronic device 100 having three or more circuit boards 104, the conductive chassis 102 has metal stand-offs at locations that match with the locations of the holes h1, h4, h5, and h6 for mounting the circuit board 104 at the first end 106. The conductive chassis 102 has metal stand-offs at locations that match with the locations of the holes h2, h4, h5, and h6 for mounting the circuit board 104 at the second end 108. The conductive chassis 102 has metal stand-offs at locations that match with the locations of the holes h3, h4, h5, and h6 for mounting the circuit board 104 between the first end 106 and the second end 108. Thus, for mounting one circuit board 104 one metal stand-off is provided to match the first hole h1, or the second hole h2, or the third hole h3. A circuit board 104 is mounted through a total of four metal stand-offs near the four corners of the circuit board 104. With this, either the first hole h1, or the second hole h2, or the third hole h3, of a circuit board 104 is provided with the chassis-ground. Thus, the locations of the metal stand-offs on the conductive chassis can help in determining the position of the circuit boards 104 mounted thereon.

Figure 2:
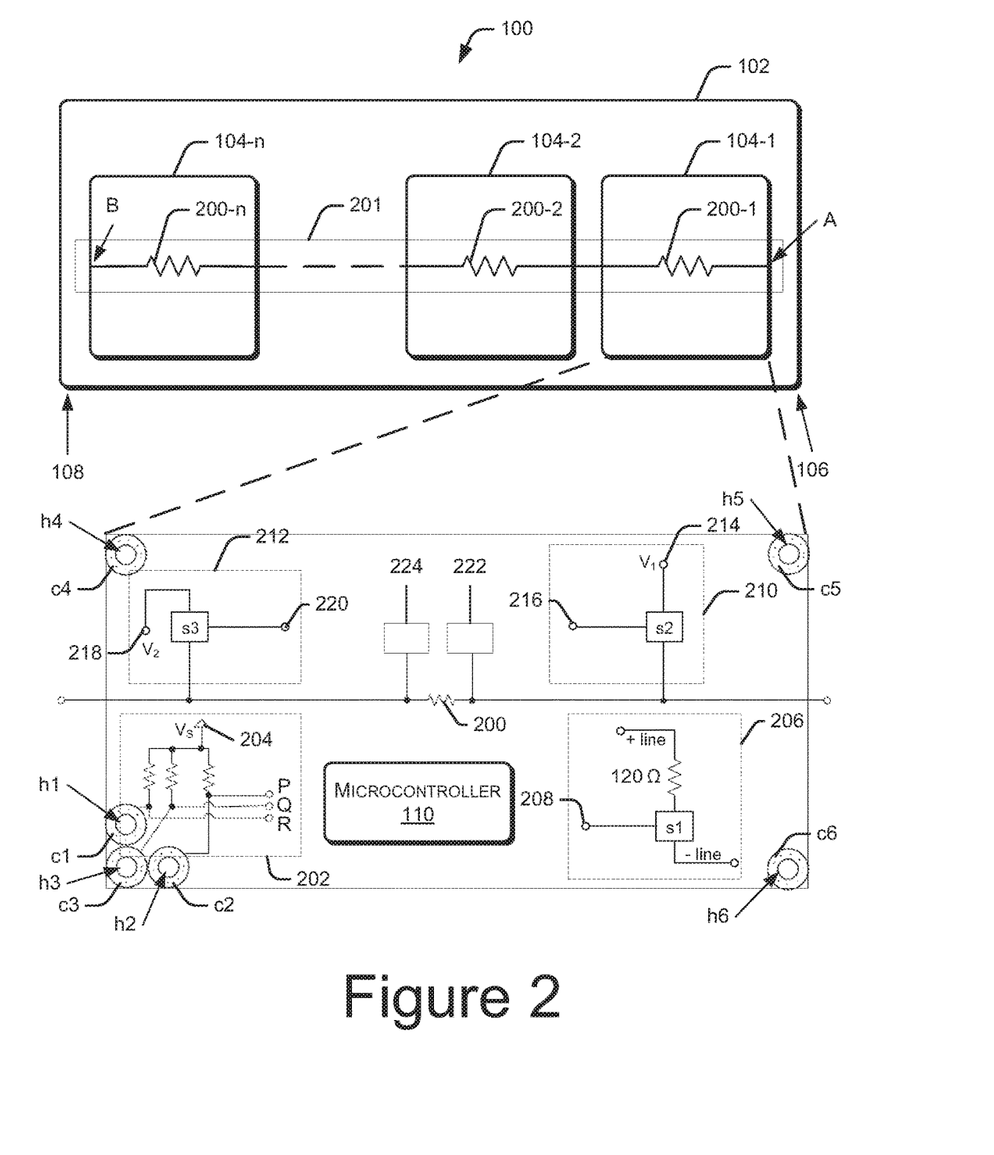
FIG. 2 illustrates an electronic device with three or more circuit boards, according to an example of the present subject matter.

FIG. 2 illustrates the electronic device 100 with three or more circuit boards 104, according to an example of the present subject matter. For the sake of simplicity, details of one circuit board 104-1 are shown in FIG. 2; however, all the circuit boards 104 of the electronic device 100 can be identical to each other and can be as illustrated in FIG. 2. The circuit board 104, apart from the holes and the microcontroller 110, includes various components, as shown. The circuit board 104 may include additional components depending upon the application or the use of the electronic device 100.

As shown, each of the circuit boards 104 has a resistive element 200-1, 200-2, . . . , 200-$n$. The circuit boards 104 are electrically coupled in series through their resistive elements 200-1, 200-2, . . . , 200-$n$, so as to form a resistive series network 201, as shown. In an example implementation, the resistive elements 200-1, 200-2, . . . , 200-$n$ are of the same resistance, with a tolerance of 1% to 5%. The series resistive network 201 has a first end referenced by A, and has a second end referenced by B. The series resistive network 201 is utilized for determining the total number of circuit boards 104 in the electronic device 100, and also for determining the ordinal position of all the circuit boards 104, as described later in the description. The resistive elements 200-1, 200-2, . . . , 200-$n$ hereinafter are collectively referred to as the resistive elements 200 and individually referred to as the resistive element 200.

The circuit board 104 has a circuit 202 coupled to the conductive contacts c1, c2, c3, as shown, through which the microcontroller 110 can determine the position of the circuit board 104. The circuit 202 is configured to couple each of the conductive contacts c1, c2, c3 to a voltage source 204 through a resistor. The voltage source 204 may be of a non-zero voltage Vs. In an example, the voltage Vs may be about 3.3 V. The microcontroller 110 can measure voltages at points P, Q, and R to determine the position of the circuit board 104. The details of determination of position are described later in the description.

The circuit board 104 also has a bus termination circuit 206. In the bus termination circuit 206, the communication lines, a high bus line (+line) and a low bus line (−line), of the differential bus of the electronic device 100 are coupled through a 120 ohm resistor and a switching element s1. In an example, the switching element s1 can be a reed relay or a solenoid-based switch. The 120 ohm resistor is a bus termination resistor. The microcontroller 110 can provide a high signal to the switching element s1, through a point 208, to turn ON the switching element s1 in order to terminate the differential bus at the circuit board 104. The turning ON of the switching element s1 inserts the 120 ohm resistor between the high bus line and the low bus line of the differential bus.

The circuit board 104 further has a first voltage providing circuit 210 and a second voltage providing circuit 212 coupled to the resistive element 200, as shown. The first voltage providing circuit 210 is coupled on one side of the resistive element 200, and the second voltage providing circuit 212 is coupled on the other side of the resistive element 200. The coupling is such that the first end A of the series resistive network 201 is terminated by the first voltage providing circuit 210, and the second end B of the series resistive network 201 is terminated by the second voltage providing circuit 212.

As shown, the first voltage providing circuit 210 includes a switching element s2 through which a voltage source 214 of a first predefined voltage V1 is coupled to the resistive element 200. The first predefined voltage V1 can be any non-zero voltage. In an example, the first predefined voltage V1 may be of about 3.3 V. The microcontroller 110 can provide a high signal to the switching element s2, through a point 216, to turn ON the switching element s2 order to provide the first predefined voltage V1 at one end of the resistive element 200.

Further, as shown, the second voltage providing circuit 212 includes a switching element s3 through which a voltage source 218 of a second predefined voltage V2 is coupled to the resistive element 200. The second predefined voltage V2 can be any voltage less than the first predefined voltage V1. In an example, the second predefined voltage V2 may be of about 0 V, provided through the ground of the circuit board 104 or of the conductive chassis 102. The microcontroller 110 can provide a high signal to the switching element s3, through a point 220, to turn ON the switching element s3 in order to provide the second predefined voltage V2 at one end of the resistive element 200.

Further, the circuit board 104 has two analog-to-digital convertors (ADCs), a first ADC 222 and a second ADC 224, coupled at the two ends of the resistive element 200, as shown. The two ADCs 222 and 224 are collectively referred to as the ADCs. The ADCs 222 and 224 convert a voltage at the respective ends of the resistive element 200 into a digital representation of the voltage. The microcontroller 110 can read the digital representation at the ADCs 222 and 224 in order to determine the voltages at the respective ends of the resistive element 200. Although the ADCs 222 and 224 are shown as separate components in FIG. 2; in an example, the ADCs 222 and 224 can be the ADCs of the microcontroller 110.

The description below describes the procedure of configuring the electronic device 100 having three or more circuit boards 104, where each circuit board 104 is as shown in FIG. 2. In configuring the electronic device 100, the position of each circuit board 104 is determined, and based on the determined position, the differential bus is terminated, the total number of circuit board 104 present in the electronic device 100 is determined, and the ordinal position of each circuit board 104 in the electronic device 100 is determined. Although the procedure of configuring the electronic device 100 having three or more circuit boards 104 is described herein; the electronic device 100 having two circuit boards can be configured in a similar manner.

With reference to FIG. 2, at first, the microcontroller 110 of each circuit board 104 may measure voltages at points P, Q, and R of the circuit 202. The voltages at points P, Q, and R are indicative of voltages at conductive contacts c1, c2, and c3, respectively. With reference to the mounting of the circuit boards 104 on the conductive chassis 102, as described earlier, if the voltages at points P, Q, R are low, high, high, respectively, the microcontroller 110 determines that the corresponding circuit board 104 is at the first end 106 of the conductive chassis 102. The voltage at point P is low due to the conductive contact c1, for the circuit board 104 at the first end 106, being at the chassis-ground. The low voltage is indicative of the ground voltage. The microcontroller 110 of this circuit board 104 provides a high signal at the point 208 to turn ON the switching element s1 in order to terminate the differential bus through the 120 ohm resistor. The microcontroller 110 of this circuit board 104 also provides a high signal at the point 216 to turn ON the switching element s2 of the first voltage providing circuit 210 to provide the first predefined voltage V1 at one end of the resistive element 200.

If the voltages at points P, Q, R are high, low, high, respectively, the microcontroller 110 determines that the corresponding circuit board 104 is at the second end 108 of the conductive chassis 102. The voltage at point Q is low due to the conductive contact c2, for the circuit board 104 at the second end 108, being at the chassis-ground. The low voltage is indicative of the ground voltage. The microcontroller 110 of this circuit board 104 provides a high signal at the point 208 to turn ON the switching element s1 in order to terminate the differential bus through the 120 ohm resistor. The microcontroller 110 of this circuit board 104 also provides a high signal at the point 220 to turn ON the switching element s3 of the second voltage providing circuit 212 to provide the second predefined voltage V2 at one end of the resistive element 200.

With the above mentioned operations by the microcontrollers 110 of the circuit boards 104, the first end A of the series resistive network 201 is set at the first predefined voltage V1, the second end B of the series resistive network 201 is set at the second predefined voltage V2, and the differential bus is terminated at the circuit boards 104 at the first end 106 and the second end 108.

Further, if the voltages at points P, Q, R are high, high, low, respectively, the microcontroller 110 determines that the corresponding circuit board 104 is in between the first end 106 and the second end 108 of the conductive chassis 102. The voltage at point R is low due to the conductive contact c3, for the circuit board 104 between the first end 106 and the second end 108, being at the chassis-ground. The low voltage is indicative of the ground voltage. For such a case, the switching element s1, the switching element s2, and the switching element s3 are kept in OFF state. In an example, the microcontrollers 110 of the circuit boards 104 in between the first end 106 and the second end 108 may operate for further measurements after a predefined time period. The predefined time period may depend on the time taken by the microcontrollers 110 of the circuit boards 104, determined to be at the first end 106 and the second end 108, to terminate the differential bus, set the first predefined voltage V1 and set the second predefined voltage V2, as described above.

After the above mentioned operations, the microcontroller 110 of each circuit board 104 measures the voltage across the corresponding resistive element 200. For this, the microcontroller 110 reads the outputs of the first ADC 222 and the second ADC 224. Based on the difference of output values of the first ADC 222 and the second ADC 224, the microcontroller 110 determines the total number of circuit boards 104 in the electronic device 100. After determining the total number of circuit boards 104, the microcontroller 110 checks the voltage at one end of the resistive element 200, which is towards the first end A of the series resistive network 201. For this, the microcontroller 110 checks the output of the first ADC 222. Based on the output value of the first ADC 222, the microcontroller 110 determines the ordinal position of the circuit board 104.

In an example, the microcontroller 110 refers to look-up tables and compares the difference of the output values of the first ADC 222 and the second ADC 224 and the output value of the first ADC 222 to determine the total number of circuit boards 104 and the ordinal position of the corresponding circuit board 104. The look-up tables include characteristic reference values of difference of output values of the first ADC 222 and the second ADC 224 for each circuit board 104 and of the output value of the first ADC 222 for each circuit board 104 depending on the total number of circuit boards 104.

Tables 1 to 3 illustrate the look-up tables having the characteristic reference values for two circuit boards 104, three circuit boards 104, and four circuit boards 104, according to an example. The values in Tables 1 to 3 are with respect to an 8-bit ADC. Here the first predefined voltage V1 is 3.3. V, which is represented at the output of an 8-bit ADC as 255, and the second predefined voltage V2 is 0 V, which is represented at the output of an 8-bit ADC as 0. In this example, 255 is the highest value that can be represented in 8 bits, and 0 is the lowest value that can be represented in 8 bits. The values with respect to 8-bit ADC are shown for the purpose of illustration. Other ADCs, for example, 10-bit ADC and such, may also be used depending on the number of circuit boards 104 in the electronic device 100. For the sake of simplicity, three look-up tables are shown; however, the look-up table with characteristic information for four or more circuit boards can be formulated. With reference to Tables 1 to 3, $V_{ADC1}$ refers to the reference output value of the first ADC 222, and $V_{ADC1}-V_{ADC2}$ refers to the reference difference of the output values of the first ADC 222 and the second ADC 224. Further, the position of circuit board refers to the ordinal position of a circuit board 104 in the electronic device 100, with position 1 referring to the circuit board 104 at the first end 106 of the conductive chassis 102.

TABLE 1

| | Total number of circuit boards 2 | |
|---|---|---|
| Position of circuit board | 1 | 2 |
| $V_{ADC1} - V_{ADC2}$ | 127 | 129 |
| $V_{ADC1}$ | 255 | 129 |

TABLE 2

| | Total number of circuit boards 3 | | |
|---|---|---|---|
| Position of circuit board | 1 | 2 | 3 |
| $V_{ADC1} - V_{ADC2}$ | 85 | 86 | 86 |
| $V_{ADC1}$ | 255 | 171 | 86 |

TABLE 3

| | Total number of circuit boards 4 | | | |
|---|---|---|---|---|
| Position of circuit board | 1 | 2 | 3 | 4 |
| $V_{ADC1} - V_{ADC2}$ | 64 | 64 | 64 | 64 |
| $V_{ADC1}$ | 255 | 192 | 128 | 64 |

To illustrate with an example, consider a case where the microcontroller 110 of one circuit board 104 reads the outputs of the first ADC 222 and the second ADC 224 as 128 and 64, respectively. The difference is 64. The microcontroller 110 matches this difference with $V_{ADC1}-V_{ADC2}$ of the look-up tables. The difference may be off from $V_{ADC1}-V_{ADC2}$ by ±1. Since, the difference matches with $V_{ADC1}-V_{ADC2}$ of Table 3, the microcontroller 110 determines that the electronic device 100 has four circuit boards 104. After this, the microcontroller 110 matches the output value of the first ADC 222 with $V_{ADC1}$ of Table 3. The output of the first ADC 222 is 128. Thus, referring to Table 3, the microcontroller 110 determines that the circuit board 104 is at the third position in the electronic device 100.

Figure 3:
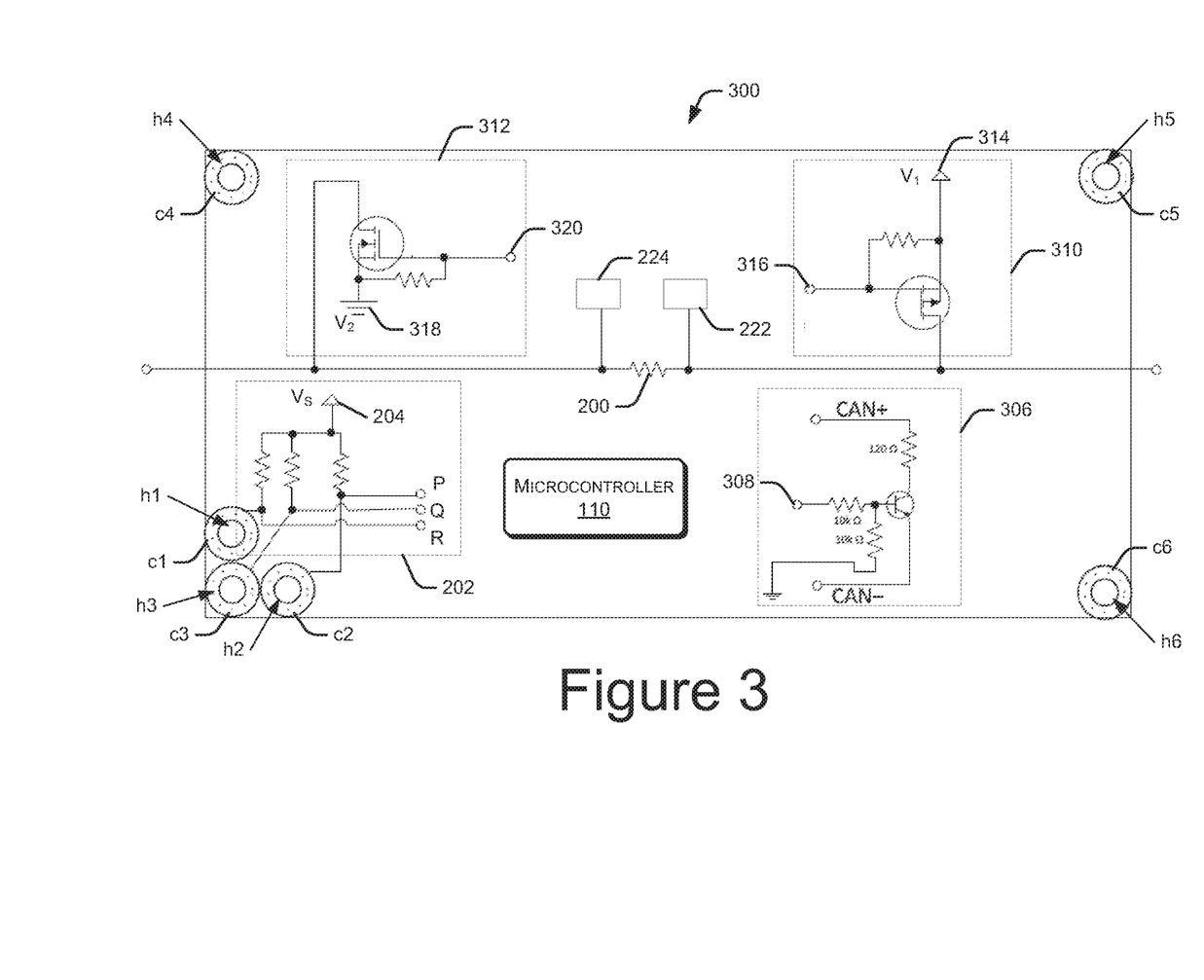
FIG. 3 illustrates a circuit board for an electronic device, according to an example of the present subject matter.

FIG. 3 illustrates a circuit board 300 for the electronic device 100, according to an example of the present subject matter. The circuit board 300 is for use in the electronic device 100 having three or more circuit boards 104. Apart from the components that are similar to the ones shown in FIG. 2, the circuit board 300 has a transistor-based bus termination circuit 306. In the bus termination circuit 306, the communication lines, a high bus line (+line) and a low bus line (−line), of the differential bus are coupled through a 120 ohm resistor and an NPN transistor, as shown. The collector of the NPN transistor is coupled to the high bus line through the 120 ohm resistor, the base of the NPN transistor is coupled to a 10 kilo-ohm resistor circuit, as shown, and the emitter of the NPN transistor is coupled to the low bus line. The microcontroller 110 can provide a high signal to the base of the NPN transistor, through a point 308, to turn ON the NPN transistor in order to terminate the differential bus at the circuit board 300. The turning ON of the NPN transistor shorts the emitter and the collector of the NPN transistor, which inserts the 120 ohm resistor between the high bus line and the low bus line of the differential bus.

The circuit board 300 also has a P-channel metal oxide semiconductor field-effect transistor (P-mosFET) based circuit 310 and an N-channel mosFET (N-mosFET) based circuit 312 coupled to the resistive element 200, as shown. The P-mosFET based circuit 310 and the N-mosFET based circuit 312 function as voltage providing circuits coupled on the two sides of the resistive element 200. The coupling is such that, in the electronic device 100 with the circuit boards 300, the first end of the series resistive network is terminated by the P-mosFET based circuit 310, and the second end of the series resistive network is terminated by the N-mosFET based circuit 312.

As shown, the P-mosFET based circuit 310 includes a P-mosFET. The drain of the P-mosFET is coupled to the resistive element 200, the source of the P-mosFET is coupled to a voltage source 314 of a first predefined voltage V1, and the gate of the P-mosFET is coupled to the source through a resistor. The first predefined voltage V1 can be any non-zero voltage. The microcontroller 110 can provide a low signal to the gate of the P-mosFET, through a point 316, to turn ON the P-mosFET in order to provide the first predefined voltage V1 at one end of the resistive element 200.

Further, as shown, the N-mosFET based circuit 312 includes an N-mosFET. The drain of the N-mosFET is coupled to the resistive element 200, the source of the N-mosFET is coupled to a voltage source 318 of a second predefined voltage V2, and the gate of the N-mosFET is coupled to the source through a resistor. The second predefined voltage V2 can be any voltage less than the first predefined voltage V1. The microcontroller 110 can provide a high signal to the gate of the N-mosFET, through a point 320, to turn ON the N-mosFET in order to provide the second predefined voltage V2 at one end of the resistive element 200.

Figure 4:
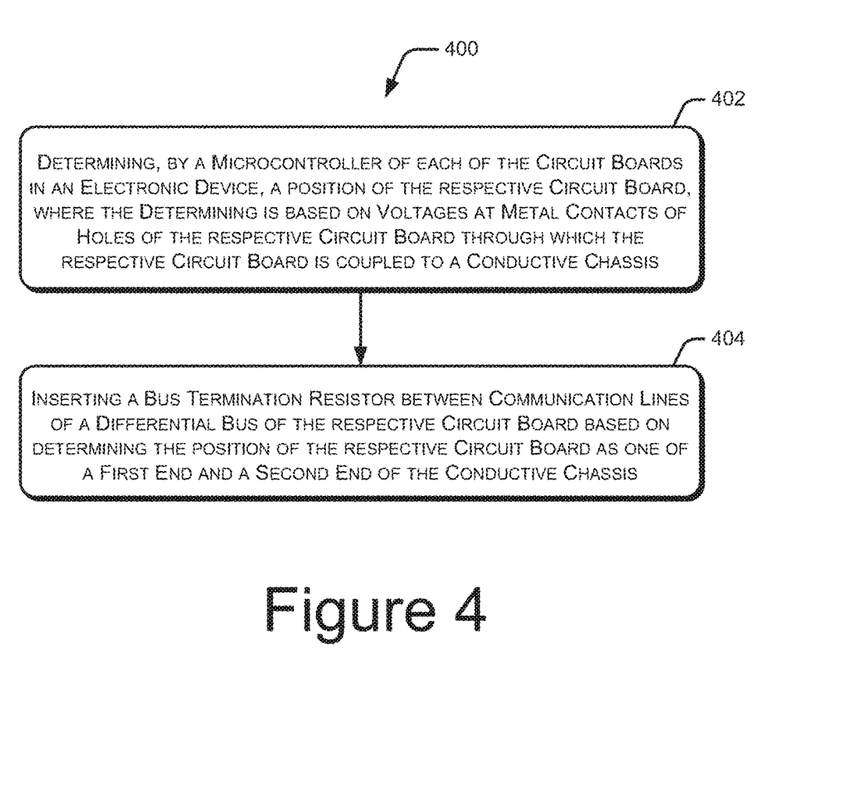
FIG. 4 illustrates a method of configuring an electronic device, according to an example of the present subject matter.

FIG. 4 illustrates a method 400 of configuring an electronic device, according to an example of the present subject matter. The order in which the method 400 is described is not intended to be construed as a limitation, and any number of the described method blocks can be combined in any order to implement the method 400, or an alternative method. It may be understood that steps of the method 400 can be performed by programmed microcontrollers.

Further, although the method 400 of configuring an electronic device may be implemented in a variety of electronic devices; in an example implementation described in FIG. 4, the method 400 is explained in context of the aforementioned electronic device 100 having two or more circuit boards 104, in accordance with the present subject matter.

Referring to FIG. 4, at block 402, for each of the circuit boards 104 in the electronic device 100, a position of the respective circuit board 104 is determined. The position is the first end 106, the second end 108, or between the first end 106 and the second end 108 of the conductive chassis 102, depending on whether the electronic device 100 has two circuit boards 104 or more circuit boards 104. The position of the circuit board 104 is determined by its microcontroller 110 based on voltages at the conductive contacts of the holes through which the respective circuit board 104 is coupled to the conductive chassis 102. The determination is done by the microcontroller 110, in a manner as described earlier in the description.

At block 404, a bus termination resistor is inserted between the communication lines of the differential bus of the respective circuit board 104 based on determining the position of the respective circuit board 104 at the first end 106 or the second end 108. The bus termination resistor is inserted to terminate the differential bus at the first end 106 and at the second end 108. In an example, the bus termination resistor is a 120 ohm resistor. The bus termination resistor is inserted electrically, by the microcontroller 110, through the bus termination circuit 206, as described earlier in the description.

Further, in an implementation, one of a first predefined voltage V1 and a second predefined voltage V2 is provided at one end of the resistive element 200 of the respective circuit board 104 based on determining the position at the first end 106 or the second end 108. With this, the first end A of the series resistive network 201 is at the first predefined voltage V1, and the second end B of the series resistive network 201 is at the second predefined voltage V2.

Further, in an implementation, a voltage difference across the resistive element 200 of each of the circuit boards 104 is measured, and the total number of circuit boards 104 that are present in the electronic device 100 is determined based on the voltage difference. In an implementation, the voltage at one end of the resistive element 200 of each of the circuit boards 104 is measured, and the ordinal position of each of the circuit boards 104 in the electronic device 100 is determined based on the voltage at the one end of the respective resistive element 200.

Although implementations for electronic devices, circuit boards, and methods of configuring electronic devices have been described in language specific to structural features and/or methods, it is to be understood that the present subject matter is not necessarily limited to the specific features or methods described. Rather, the specific features and methods are disclosed and explained as example implementations for electronic devices, circuit boards and methods of configuring the electronic devices.

We claim:

1. An electronic device comprising:
a conductive chassis; and
multiple circuit boards, each of the multiple circuit boards comprising a respective first hole at a first location with a conductive contact, a respective second hole at a second location with a conductive contact, and a microcontroller, wherein
a first circuit board, from amongst the multiple circuit boards, is mounted on a first end of the conductive chassis through a metal stand-off at the first hole of the first circuit board;
a second circuit board, from amongst the multiple circuit boards, is mounted on a second end of the conductive chassis through a metal stand-off at the second hole of the second circuit board; and
the microcontroller of each of the multiple circuit boards is programmed to measure voltages at the conductive contact of the respective first hole and at the conductive contact of the respective second hole to determine a position of the respective circuit board.

2. The electronic device as claimed in claim 1, wherein the microcontroller of each of the multiple circuit boards is programmed to
determine that the respective circuit board is positioned at the first end when a voltage at the conductive contact of the respective first hole is a ground voltage; and
determine that the position of the respective circuit board is positioned at the second end when a voltage at the conductive contact of the respective second hole is a ground voltage.

3. The electronic device as claimed in claim 1, wherein each of the multiple circuit boards comprises a third hole at a third location with a conductive contact, and wherein
a circuit board, from amongst the multiple circuit boards, is mounted between the first end and the second end of the conductive chassis through a metal stand-off at the third hole; and
the microcontroller of each of the multiple circuit boards is programmed to measure a voltage at the conductive contact of the respective third hole and determine that the respective circuit board is positioned between the first end and the second end when a voltage at the conductive contact of the respective third hole is a ground voltage.

4. The electronic device as claimed in claim 1, wherein each of the multiple circuit boards comprises a bus termination resistor, and wherein
the microcontroller of each of the multiple circuit boards is programmed to insert the bus termination resistor between communication lines of a differential bus of the respective circuit board based on determining the position of the respective circuit board as one of the first end and the second end.

5. The electronic device as claimed in claim 1, wherein each of the multiple circuit boards comprises a resistive element, the multiple circuit boards are coupled in series such that resistive elements of the multiple circuit boards form a series resistive network, and wherein
the microcontroller of each of the multiple circuit boards is programmed to set an end of the resistive element of the respective circuit board to one of a first predefined voltage and a second predefined voltage based on determining the position of the respective circuit board as one of the first end and the second end.

6. The electronic device as claimed in claim 5, wherein the microcontroller of each of the multiple circuit boards is programmed to
measure a voltage difference across the resistive element of the respective circuit board; and
determine a total number of circuit boards present in the electronic device, based on the voltage difference.

7. The electronic device as claimed in claim 6, wherein the microcontroller of each of the multiple circuit boards is programmed to
   measure a voltage at one end of the resistive element of the respective circuit board; and
   determine an ordinal position of the respective circuit board in the electronic device, based on the voltage at the one end of the resistive element.

8. The electronic device as claimed in claim 5, wherein the second predefined voltage is lower than the first predefined voltage.

9. A method of configuring an electronic device, the electronic device comprising multiple circuit boards, each having a microcontroller and a bus termination resistor, wherein the method comprises:
   determining, by the microcontroller of each of the multiple circuit boards, a position of the respective circuit board, wherein the determining is based on voltages at conductive contacts of holes of the respective circuit board through which the respective circuit board is coupled to a conductive chassis; and
   inserting the bus termination resistor between communication lines of a differential bus of the respective circuit board based on determining the position of the respective circuit board as one of a first end and a second end of the conductive chassis.

10. The method as claimed in claim 9, wherein each of the multiple circuit boards comprises a first hole at a first location with a conductive contact, a second hole at a second location with a conductive contact, and a third hole at a third location with a conductive contact, wherein the determining comprises:
   identifying that the respective circuit board is positioned at the first end when a voltage at the conductive contact of the respective first hole is a ground voltage;
   identifying that the respective circuit board is positioned at the second end when a voltage at the conductive contact of the respective second hole is a ground voltage; and
   identifying that the respective circuit board is positioned between the first end and the second end when a voltage at the conductive contact of the respective third hole is a ground voltage.

11. The method as claimed in claim 9, wherein each of the multiple circuit boards comprises a resistive element and the multiple circuit boards are coupled in series to form a series resistive network by resistive elements of the multiple circuit boards, wherein the method comprises:
   providing one of a first predefined voltage and a second predefined voltage at an end of the resistive element of the respective circuit board based on determining the position of the respective circuit board as one of the first end and the second end, such that one end of the series resistive network is at one of the first predefined voltage and the second predefined voltage.

12. The method as claimed in claim 11 further comprising:
   measuring a voltage difference across the resistive element of each of the multiple circuit boards; and
   based on the voltage difference, determining a total number of circuit boards that are present in the electronic device.

13. The method as claimed in claim 12 further comprising:
   measuring a voltage at one end of the resistive element of each of the multiple circuit boards; and
   determining an ordinal position of each of the multiple circuit boards in the electronic device based on the voltage at the one end of the respective resistive element.

14. A circuit board for an electronic device, the circuit board comprising:
   at least two holes at two locations on the circuit board, wherein each of the at least two holes has a conductive contact coupled to a voltage source through a resistor; and
   a microcontroller programmed to
      measure voltages at conductive contacts of the at least two holes; and
      determine a position of the circuit board, when positioned on a conductive chassis of the electronic device, based on the measured voltages, wherein the position of the circuit board is one of a first end and a second end, and in between the first end and the second end, of the conductive chassis.

15. The circuit board as claimed in claim 14 further comprising:
   a resistive element;
   a first voltage providing circuit having a switching element coupled to a first end of the resistive element; and
   a second voltage providing circuit having a switching element coupled to a second end of the resistive element,
   wherein the microcontroller is programmed to
      turn ON the switching element of the first voltage providing circuit to set a first predefined voltage at the first end of the resistive element based on determining the position of the circuit board, when positioned on the conductive chassis, at the first end; and
      turn ON the switching element of the second voltage providing circuit to set a second predefined voltage at the second end of the resistive element based on determining the position of the circuit board, when positioned on the conductive chassis, at the second end, wherein the second predefined voltage is lower than the first predefined voltage.

* * * * *